United States Patent
Huang et al.

(10) Patent No.: US 12,045,460 B2
(45) Date of Patent: Jul. 23, 2024

(54) TEMPERATURE CONTROL METHOD AND DATA STORAGE SYSTEM

(71) Applicant: Acer Incorporated, New Taipei (TW)

(72) Inventors: Yi-Jhong Huang, New Taipei (TW); Tz-Yu Fu, New Taipei (TW)

(73) Assignee: Acer Incorporated, New Taipei (TW)

( * ) Notice: Subject to any disclaimer, the term of this patent is extended or adjusted under 35 U.S.C. 154(b) by 378 days.

(21) Appl. No.: 17/529,294

(22) Filed: Nov. 18, 2021

(65) Prior Publication Data
US 2022/0187987 A1 Jun. 16, 2022

(30) Foreign Application Priority Data
Dec. 15, 2020 (TW) ................. 109144207

(51) Int. Cl.
*G06F 3/06* (2006.01)
*G05B 15/02* (2006.01)

(52) U.S. Cl.
CPC ........... *G06F 3/0604* (2013.01); *G05B 15/02* (2013.01); *G06F 3/0653* (2013.01); *G06F 3/0679* (2013.01)

(58) Field of Classification Search
CPC ........ G06F 3/0634; G06F 3/0653; G11C 7/04
See application file for complete search history.

(56) References Cited

U.S. PATENT DOCUMENTS

| | | | | |
|---|---|---|---|---|
| 10,115,471 B1* | 10/2018 | Yang | .................. | G11C 16/30 |
| 11,262,936 B2* | 3/2022 | Ishii | .................. | G06F 3/0655 |
| 2009/0052266 A1* | 2/2009 | Askar | .................. | G06F 13/161 |
| | | | | 365/212 |
| 2013/0339624 A1* | 12/2013 | Sugizaki | .............. | G06F 12/122 |
| | | | | 711/136 |
| 2014/0343748 A1 | 11/2014 | Suzuki | | |
| 2015/0301744 A1* | 10/2015 | Kim | .................. | G06F 3/0679 |
| | | | | 711/103 |
| 2017/0371577 A1* | 12/2017 | Liu | .......................... | G06F 1/28 |
| 2018/0046231 A1* | 2/2018 | Raghu | .................. | G06F 1/3275 |
| 2018/0284857 A1* | 10/2018 | Yang | .................. | G11C 5/04 |
| 2018/0349243 A1* | 12/2018 | Shin | .................. | G06F 3/0653 |
| 2019/0043559 A1* | 2/2019 | McVay | .................. | G06F 3/0634 |
| 2019/0073007 A1* | 3/2019 | Izumi | .................. | G06F 12/0246 |
| 2019/0107945 A1* | 4/2019 | Chun | .................. | G06F 3/0679 |
| 2019/0339755 A1* | 11/2019 | Chai | .................. | G06F 1/305 |
| 2019/0339881 A1 | 11/2019 | Scott, III | | |

(Continued)

FOREIGN PATENT DOCUMENTS

| | | |
|---|---|---|
| CN | 104898982 | 9/2015 |
| CN | 108594971 | 9/2018 |

(Continued)

*Primary Examiner* — Vincent H Tran
(74) *Attorney, Agent, or Firm* — JCIPRNET

(57) ABSTRACT

A temperature control method and a data storage system are disclosed. The method includes: detecting whether a memory device is in a busy status; detecting whether a temperature of the memory device is higher than a first threshold value; instructing the memory device to perform a cool down procedure in response to that the memory device is in the busy status and the temperature of the memory device is higher than the first threshold value; and instructing the memory device to stop the cool down procedure in response to that the memory device is not in the busy status and the temperature of the memory device is lower than a second threshold value.

10 Claims, 3 Drawing Sheets

(56) References Cited

U.S. PATENT DOCUMENTS

| | | | | |
|---|---|---|---|---|
| 2019/0369871 A1* | 12/2019 | Gaskill | ............... | G06F 12/0246 |
| 2020/0050246 A1 | 2/2020 | Karalnik et al. | | |
| 2020/0394510 A1* | 12/2020 | Peng | .................... | G06F 3/0683 |
| 2022/0113881 A1* | 4/2022 | Roberts | ................ | G06F 3/0659 |

FOREIGN PATENT DOCUMENTS

| | | |
|---|---|---|
| CN | 110196624 | 9/2019 |
| CN | 110556139 | 12/2019 |
| CN | 111831024 | 10/2020 |
| TW | 200917269 | 4/2009 |
| TW | 202038037 | 10/2020 |

\* cited by examiner

TEMPERATURE CONTROL METHOD AND DATA STORAGE SYSTEM

CROSS-REFERENCE TO RELATED APPLICATION

This application claims the priority benefit of Taiwan application serial no. 109144207, filed on Dec. 15, 2020. The entirety of the above-mentioned patent application is hereby incorporated by reference herein and made a part of this specification.

BACKGROUND

1. Technical Field

The disclosure relates to a temperature control technology, and particularly relates to a temperature control method and data storage system.

2. Description of Related Art

Generally speaking, memory devices or other types of electronic devices generally have a built-in temperature control mechanism. When the temperature inside the device is too high, the temperature control mechanism can be activated to lower the temperature. However, the temperature control mechanism adopted by most electronic devices is preset according to the temperature change curve estimated by the manufacturer. Taking a memory device as an example, when the temperature is higher than a preset threshold value, the memory device may generally be cooled by a preset cool down method (such as reducing data access performance). However, in the actual operation of the memory device in conjunction with the host system, when the memory device is in a busy status, even if the temperature of the memory device drops temporarily, once the cool down procedure is stopped, the temperature of the memory device may immediately rise again. Repeatedly starting and stopping the cool down procedure may not only cause unstable access performance of the memory device, but also lead to insufficient cooling of the memory device and damage to the device.

SUMMARY

The disclosure provides a temperature control method and data storage system, which is capable of improving the temperature control capability of a memory device.

A temperature control method is disclosed. The temperature control method includes: detecting whether the memory device is in a busy status; detecting whether the temperature of the memory device is higher than a first threshold value; instructing the memory device to perform a cool down procedure in response to that the memory device is in the busy status and the temperature of the memory device is higher than the first threshold value; and instructing the memory device to stop the cool down procedure in response to that the memory device is not in the busy status and the temperature of the memory device is lower than a second threshold value.

A data storage system is further disclosed. The data storage system includes a host system and a memory device. The memory device is coupled to the host system. The host system is configured to detect whether the memory device is in a busy status. The host system is further configured to detect whether a temperature of the memory device is higher than a first threshold value. The host system is further configured to instruct the memory device to perform a cool down procedure in response to that the memory device is in the busy status and the temperature of the memory device is higher than the first threshold value. The host system is further configured to instruct the memory device to stop the cool down procedure in response to that the memory device is not in the busy status and the temperature of the memory device is lower than a second threshold value.

Based on the above, according to the disclosure, a double verification of determining whether to start (or to stop) the cool down procedure of the host system according to whether the memory device is in the busy status and whether the temperature of the memory device is higher than the first threshold value (or lower than the second threshold value) is proposed. In this way, the temperature control capability of the memory device can be improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
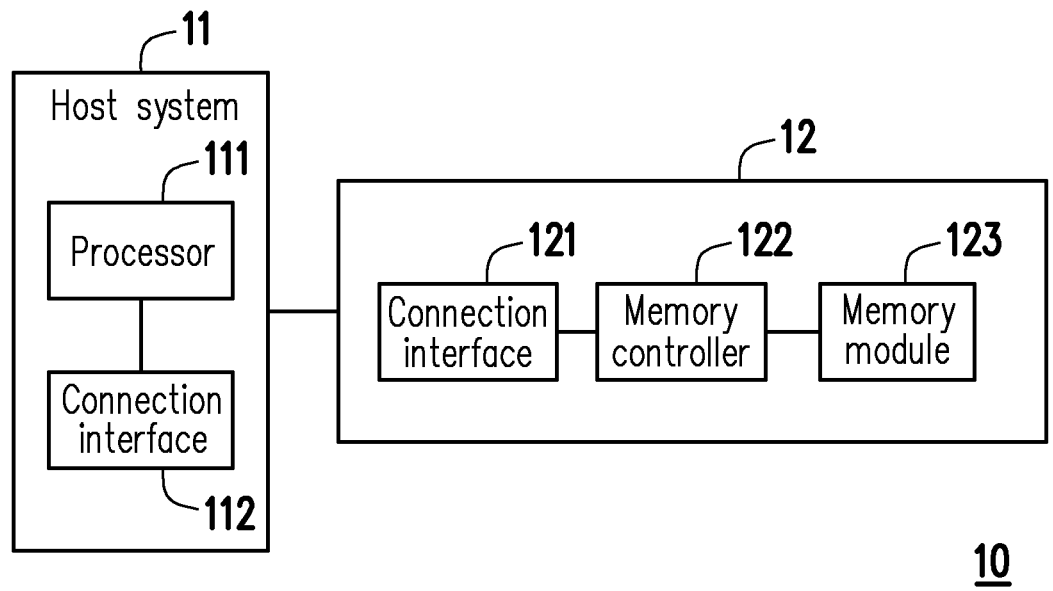
FIG. 1 is a schematic diagram of a data storage system according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

FIG. 1 is a schematic diagram of a data storage system according to an embodiment of the disclosure. Please refer to FIG. 1. A data storage system 10 includes a host system 11 and a memory device 12. The host system 11 may store data in the memory device 12 or read data from the memory device 12. For example, the host system 11 may be any system essentially cooperating with the memory device 12 to store data, such as a computer system, digital camera, video camera, communication device, audio player, video player, tablet, or the like, while the memory device 12 may be all kinds of non-volatile memory devices such as a flash drive, memory card, solid state drive (SSD), secure digital (SD) card, compact flash (CF) card, or embedded storage device.

In the present embodiment, the host system 11 may include a processor 111 and a connection interface 112. The processor 111 may include a central processing unit (CPU) or other programmable general-purpose or special-purpose micro-processors, digital signal processors (DSP), programmable controllers, application specific integrated circuits (ASIC), programmable logic devices (PLD), or other similar devices or a combination of thereof. The processor 111 is configured to control the whole or part of the operation of the host system 11. In the following embodiments, the description of the operation of the host system 11 may be equivalent to the description of the operation of the processor 111.

The connection interface 112 is coupled to the processor 111 and is configured to transmit data to the memory device 12 or receive data from the memory device 12. In one embodiment, the host system 11 also includes any hardware devices required in practice, such as battery units, network interface cards, keyboards (or touchpads), screens, and/or speakers, and the like.

The memory device 12 includes a connection interface 121, a memory controller 122, and a memory module 123. The connection interface 121 is configured to connect to the connection interface 112 of the host system 11 and communicate with the host system 11 via the connection interface 112. In one embodiment, the connection interface 112 and the connection interface 121 meet the NVM Express (NVMe) interface specification. In another embodiment, the connection interface 112 and the connection interface 121 may also meet various standards for connection interfaces such as the serial advanced technology attachment (SATA), parallel advanced technology attachment (PATA), high-speed peripheral component interconnect express (PCI Express), or universal serial bus (USB).

The memory controller 122 is coupled to the connection interface 121 and the memory module 123. The memory controller 122 is configured to perform multiple logic gates or control commands implemented in hardware or firmware form, and perform operations such as writing, reading, and erasing data in the memory module 123 according to the instructions of the host system 11. Moreover, the memory controller 122 may also control the overall operation of the memory device 12. In one embodiment, the memory controller 122 is also referred to as a flash memory controller.

The memory module 123 is configured to store the data written by the host system 11. For example, the memory module 123 may include a single-level cell (SLC) NAND flash memory module (that is, a flash memory module in which one memory cell may store one bit), a multi-level cell (MLC) NAND flash memory module (i.e., a flash memory module in which one memory cell may store two bits), a triple-level cell (TLC) NAND flash memory module (i.e., a flash memory module in which a memory cell may store three bits), and/or a quad-level cell (QLC) NAND flash memory module (i.e., a flash memory module in which a memory cell may store four bits). In addition, the memory cells in the memory module 123 store data with changes of a critical voltage.

In one embodiment, the host system 11 may detect whether the memory device 12 is in a busy status. In the busy status, since the memory device 12 may need to continuously process instructions from the host system 11 and/or perform other data access operations (for example, performing writing operation or performing reading operation on the memory module 123), the temperature of the memory device 12 is more likely to rise.

In one embodiment, the host system 11 may detect the temperature of the memory device 12. For example, a temperature sensor may be configured inside the memory device 12. The temperature sensor may be configured to detect and record a temperature of the memory device 12. The host system 11 may read the temperature data recorded by the temperature sensor from the memory device 12. In addition, the host system 11 may detect whether the temperature of the memory device 12 is higher than a threshold value (also referred to as a first threshold value). The first threshold value may be 65 degrees or other temperature values, for example.

In one embodiment, it is assumed that the host system 11 determines that the memory device 12 is in the busy status and at the same time the temperature of the memory device 12 is higher than the first threshold value. At this time, in response to that the memory device 12 is in the busy status and the temperature of the memory device 12 is higher than the first threshold value, the host system 11 may instruct the memory device 12 to perform a cool down procedure. The cool down procedure may help reduce the temperature of the memory device 12.

In one embodiment, the cool down procedure is dedicated to cooling the memory device 12 that is in the busy status. For example, in the cool down procedure, the cool down methods that the memory controller 122 may use may include, but are not limited to, any technical methods that may be used to cool the memory device 12, such as changing a working status of the memory device 12 (for example, from PS0 to PS1), reducing a clock frequency of the memory device 12, reducing an operating voltage of the memory device 12, reducing an access speed to the memory module 123, and/or reducing a power consumption of a decoding engine of the memory device 12.

In one embodiment, after the cool down procedure is started, the host system 11 may continue to detect whether the memory device 12 is in the busy status and whether the temperature of the memory device 12 is lower than another threshold value (also referred to as a second threshold value). The second threshold value may be 55 degrees or other temperature values lower than the first threshold value, for example.

In one embodiment, it is assumed that the host system 11 determines that the memory device 12 is already not in the busy status and also the temperature of the memory device 12 is lower than the second threshold value. At this time, in response to that the memory device 12 is not in the busy status and the temperature of the memory device 12 is lower than the second threshold value, the host system 11 may instruct the memory device 12 to stop the cool down procedure.

In one embodiment, the host system 11 may read a count value from the memory device 12. This count value may reflect a cumulative time length in which the memory device 12 is in the busy status. The host system 11 may determine whether the memory device 12 is in the busy status according to the count value.

In one embodiment, the memory controller 122 may determine whether the memory device 12 is in the busy status according to a current operating status of the memory device 12. In response to that a preset time length is added into a time in which the memory device 12 is in the busy status, and the memory controller 122 may update the count value. For example, assuming that the preset time length is one minute, when the time in which the memory controller 122 is continuously in the busy status (such as performing a write or read operation) is increased by one minute, the memory controller 122 may add one into the count value.

In one embodiment, after the count value is reset, the count value may reflect the cumulative time length in which the memory device 12 is in the busy status. For example, assuming that a current count value is five, it means that the cumulative time length in which the memory device 12 is in the busy status is five minutes since the count value has been reset. Further, if the memory controller 122 enters an idle status (such as stopping to perform the writing or reading operation), the memory controller 122 may suspend accumulating the accumulated time in which the memory device 12 is in the busy status and may suspend updating the count value.

Figure 2:
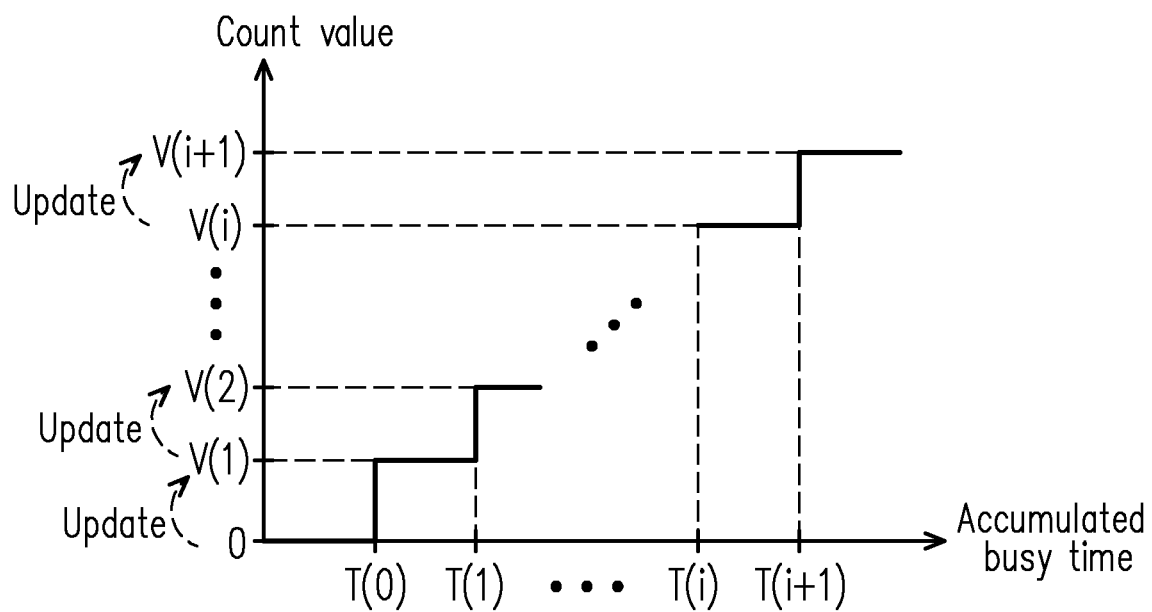
FIG. 2 is a schematic diagram showing a correspondence between a count value and an accumulated busy time of a memory device according to an embodiment of the disclosure.

FIG. 2 is a schematic diagram showing a correspondence between a count value and an accumulated busy time of a memory device according to an embodiment of the disclosure. Referring to FIG. 2, in one embodiment, the correspondence between the count value and the accumulated busy time of the memory device 12 (that is, the accumulated time length of the memory device 12 in the busy status) may be as shown in FIG. 2. In other words, as the cumulative busy time of the memory device 12 continues to increase (for example, from T(0) to T(i+1)), the count value may also be continuously updated (for example, from V(1) to V(i+1)). For example, when the accumulated busy time of the memory device 12 increases from 0 to T(0), the count value may also be updated from 0 to V(1). When the accumulated busy time of the memory device 12 increases from T(0) to T(1), the count value may also be updated from V(1) to V(2). In this way, when the accumulated busy time of the memory device 12 increases from T(i) T(i+1), the count value may also be updated from V(i) to V(i+1).

In an embodiment, the host system 11 may read a count value (also referred to as a first count value) recorded at a certain time point (also referred to as a first time point) from the memory device 12. Later, the host system 11 may read a count value (also referred to as a second count value) recorded at another time point (also referred to as a second time point) from the memory device 12. The first time point may be earlier than the second time point. For example, there may be a three-minute interval or a certain sampling time interval between the first time point and the second time point.

Figure 3:
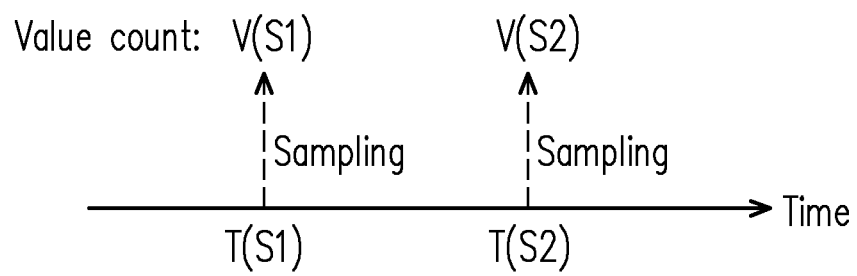
FIG. 3 is a schematic diagram of a temporal correlation between a first count value and a second count value according to an embodiment of the disclosure.

FIG. 3 is a schematic diagram of a temporal correlation relationship between a first count value and a second count value according to an embodiment of the disclosure. Referring to FIG. 3, it is assumed that the first time point is time point T(S1), the second time point is time point T(S2), and time point T(S1) is earlier than time point T(S2). There may be a sampling time interval (for example, three minutes) between the time point T (S1) and the time point T (S2). A count value V(S1) may represent a value obtained by reading or sampling the count value of FIG. 2 at the time point T(S1). A count value V(S2) may represent a value obtained by reading or sampling the count value of FIG. 2 at the time point T(S2).

In one embodiment, the host system 11 may determine whether the memory device 12 is in the busy status according to a relative value relationship between the first count value and the second count value. For example, the relative value relationship may refer to a value relationship between the first count value and the second count value in terms of magnitude. For example, the relative value relationship may include that the second count value is larger than the first count value, the second count value is equal to the first count value, and the second count value is smaller than the first count value.

In an embodiment, if the relative value relationship between the first count value and the second count value is that the second count value is larger than the first count value, it means that in the sampling time interval of the two count values, the cumulative busy time of the memory device 12 continues to increase (causing the value of the count value to change or increase). Therefore, the host system 11 can determine that the memory device 11 is in the busy status according to that the second count value is larger than the first count value.

In an embodiment, if the relative value relationship between the first count value and the second count value is that the second count value is not larger than (or is equal to) the first count value, it means that in the sampling time interval of the two count values, the cumulative busy time of the memory device 12 did not continue to increase (there is no change or increase between the two samplings). Therefore, the host system 11 can determine that the memory device 11 is not in the busy status according to that the second count value is not larger than (or is equal to) the first count value.

In one embodiment, the host system 11 may instruct the memory device 12 to stop the cool down procedure only when the host system 11 determines that two conditions are both met: the memory device 12 is already not in the busy status (or is out of the busy status), and the temperature of the memory device 12 is lower than the second threshold value. In other words, in one embodiment, if the host system 11 determines that the memory device 12 is still in the busy status, then the host system 11 does not instruct the memory device 12 to stop the cool down procedure regardless of whether the temperature of the memory device 12 is lower than the second threshold value. Alternatively, in one embodiment, if the host system 11 determines that the memory device 12 is not in the busy status but the temperature of the memory device 12 is not lower than the second threshold value, then the host system 11 also does not instruct the memory device 12 to stop the cool down procedure.

From another perspective, in one embodiment, once the cool down procedure is started when the memory device 12 is in the busy status, the host system 11 can subsequently instruct the memory device 12 to stop the cool down procedure currently being performed only when the host system 11 determines that the two conditions are both met: the memory device 12 is out of the busy status, and the temperature of the memory device 12 is lower than the second threshold value. In this way, it is possible to reduce the repeated starting and stopping of the cool down procedure before the memory device 12 is out of the busy status, thereby improving the operating stability of the memory device 12.

In one embodiment, after the cool down procedure is started, the memory controller 122 may compare the temperature of the memory device 12 with at least one of at least two threshold values (referred to as a third threshold value and a fourth threshold value, for example). The fourth threshold value is higher than the third threshold value. The third threshold value may be 67 degrees, and the fourth threshold value may be 69 degrees, for example. The memory controller 122 may adjust the cool down method used in the cool down procedure according to the comparison result until the cool down procedure is stopped. It should be noted that the aforementioned threshold values may be adjusted according to practical requirements, and is not limited in the disclosure.

For example, in a cool down procedure of an embodiment, if the temperature of the memory device 12 is not higher than the third threshold value, the memory controller 122 may perform an initial cool down method to initially cool the memory device 12. If the temperature of the memory device 12 is between the third threshold value and the fourth threshold value, the memory controller 122 may perform an advanced cool down method to further cool the memory device 12. Furthermore, if the temperature of the memory device 12 is higher than the fourth threshold value, the memory controller 122 may perform an intense cool down method to intensely cool the memory device 12. The cooling efficiency of the intense cool down method is higher than the cooling efficiency of the advanced cool down method, and the cooling efficiency of the advanced cool down method is higher than the cooling efficiency of the initial cool down method. Furthermore, at least one of the aforementioned various cool down methods may be used in the cool down method at each stage, so as to achieve the cooling requirements needed.

Figure 4:
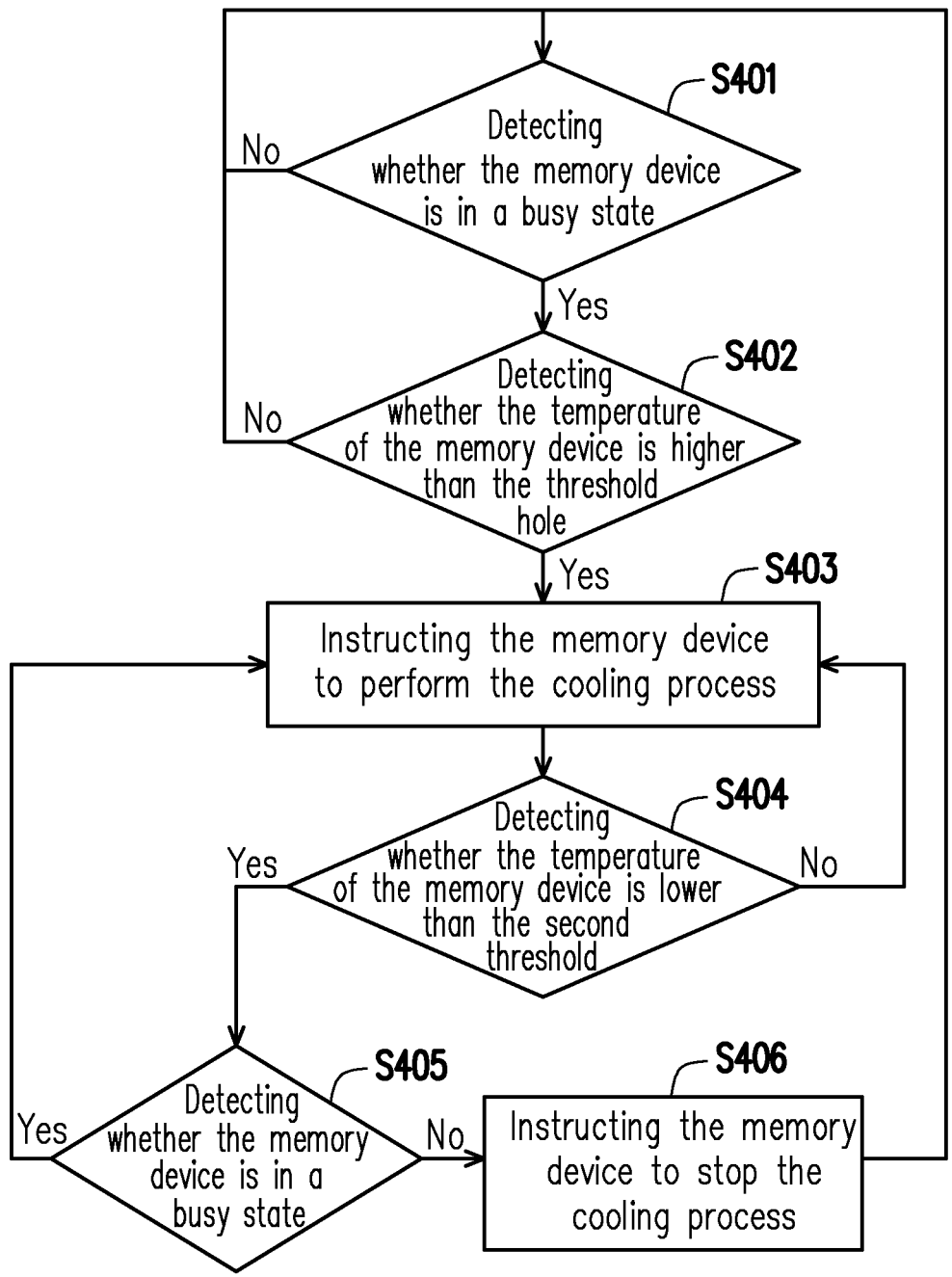
FIG. 4 is a flowchart of a temperature control method according to an embodiment of the disclosure.

FIG. 4 is a flowchart of a temperature control method according to an embodiment of the disclosure. Please refer to FIG. 4. In step S401, whether the memory device is in a busy status is detected. If the memory device is in the busy status, in step S402, whether the temperature of the memory device is higher than the first threshold value is detected. In response to that the memory device is in the busy status and the temperature of the memory device is higher than the first threshold value, in step S403, the memory device is instructed to perform the cool down procedure. However, if it is determined in step S401 that the memory device is not in the busy status, or if it is determined in step S402 that the temperature of the memory device is not higher than the first threshold value, then it is possible to return to step S401 without proceeding to step S403.

After the cool down procedure is started, in step S404, whether the temperature of the memory device is lower than the second threshold value is detected. If the temperature of the memory device is lower than the second threshold value, in step S405, whether the memory device is in the busy status is detected. In response to that the memory device is not in the busy status and the temperature of the memory device is lower than the second threshold value, in step S406, the memory device is instructed to stop the cool down procedure. However, it should be noted that after the cool down procedure is started, if the two conditions are not both met: the memory device is not in the busy status and the temperature of the memory device is lower than the second threshold value, it is possible to return to step S403 and instruct the memory device to maintain the cool down procedure until the aforementioned two conditions are both met.

Each step in FIG. 4 has been described in detail as above, and will not be repeated here. It should be noted that each step in FIG. 4 may be implemented as multiple program codes or circuits, and is not limited in the disclosure. Moreover, in the disclosure, the method in FIG. 4 may be used in conjunction with the above exemplary embodiments, or may be used alone, without limitation.

In summary, according to the embodiments of the disclosure, a double verification that may determine whether to start (or to stop) the cool down procedure of the host system according to whether the memory device is in the busy status and whether the temperature of the memory device is higher than the first threshold value (or lower than the second threshold value) is proposed. In this way, it is possible to reduce the repeated starting and stopping of the cool down procedure before the memory device is out of the busy status, thereby improving the operating stability of the memory device and/or improving the temperature control capability of the memory device.

Although the disclosure has been disclosed in the above embodiments, it is not intended to limit the disclosure. Anyone with ordinary knowledge in the art can make some changes and modifications without departing from the spirit and scope of the disclosure, and the scope of protection of the disclosure shall be subject to those defined by the following claims.

What is claimed is:

1. A temperature control method, controlling a temperature of a memory device, the temperature control method comprising:
   reading a count value from the memory device, wherein the count value reflects a cumulative time length in which the memory device is in a busy status in a past time period;
   determining whether the memory device is in the busy status according to the count value;
   detecting whether the temperature of the memory device is higher than a first threshold value;
   instructing the memory device to perform a cool down procedure in response to that the memory device is in the busy status and the temperature of the memory device is higher than the first threshold value; and
   instructing the memory device to stop the cool down procedure in response to that the memory device is not in the busy status and the temperature of the memory device is lower than a second threshold value.

2. The temperature control method as described in claim 1, further comprises:
   in a situation that the memory device is in the busy status and the temperature of the memory device is lower than the second threshold value, not instructing the memory device to stop the cool down procedure.

3. The temperature control method as described in claim 1, wherein the count value comprises a first count value read from the memory device at a first time point and a second count value read from the memory device at a second time point, the second time point is later than the first time point, and a step of determining whether the memory device is in the busy status according to the count value comprises:
   determining whether the memory device is in the busy status according to a value relative relationship between the first count value and the second count value.

4. The temperature control method as described in claim 3, wherein a step of determining whether the memory device is in the busy status according to the value relative relationship between the first count value and the second count value comprises:
   determining that the memory device is in the busy status, if the second count value is larger than the first count value; and
   determining that the memory device is not in the busy status, if the second count value is not larger than the first count value.

5. The temperature control method as described in claim 1, further comprising:
   the memory device updating the count value in response to that a preset time length is added into a time in which the memory device is in the busy status.

6. A data storage system, comprising:
   a host system; and
   a memory device, coupled to the host system,
   wherein the host system is configured to read a count value from the memory device, wherein the count value reflects a cumulative time length in which the memory device is in a busy status in a past time period,
   the host system is further configured to determine whether the memory device is in the busy status, the host system is further configured to detect whether a temperature of the memory device is higher than a first threshold value, the host system is further configured to instruct the memory device to perform a cool down procedure in response to that the memory device is in the busy status and the temperature of the memory device is higher than the first threshold value, and the host system is further configured to instruct the memory device to stop the cool down procedure in response to that the memory device is not in the busy status and the temperature of the memory device is lower than a second threshold value.

7. The data storage system as described in claim 6, wherein the host system is further configured to:

in a situation that the memory device is in the busy status and the temperature of the memory device is lower than the second threshold value, not instruct the memory device to stop the cool down procedure.

8. The data storage system as described in claim 6, wherein the count value comprises a first count value recorded by the memory device at a first time point and a second count value recorded by the memory device at a second time point, the second time point is later than the first time point, and an operation of determining whether the memory device is in the busy status according to the count value comprises:

determining whether the memory device is in the busy status according to a value relative relationship between the first count value and the second count value.

9. The temperature control method as described in claim 8, wherein an operation of determining whether the memory device is in the busy status according to the value relative relationship between the first count value and the second count value comprises:

determining that the memory device is in the busy status, if the second count value is larger than the first count value; and determining that the memory device is not in the busy status, if the second count value is not larger than the first count value.

10. The data storage system as described in claim 6, wherein the memory device is configured update the count value in response to that a preset time length is added into a time in which the memory device is in the busy status.

* * * * *